(12) United States Patent
Chidambarrao et al.

(10) Patent No.: US 6,703,274 B1
(45) Date of Patent: Mar. 9, 2004

(54) BURIED STRAP WITH LIMITED OUTDIFFUSION AND VERTICAL TRANSISTOR DRAM

(75) Inventors: Dureseti Chidambarrao, Weston, CT (US); Ramachandra Divakaruni, Ossining, NY (US); Jack A. Mandelman, Flat Rock, NC (US); Raymond Van Roijen, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/336,988

(22) Filed: Jan. 3, 2003

(51) Int. Cl.[7] .......................................... H02L 21/8242
(52) U.S. Cl. ...................... 438/243; 438/234; 438/246; 257/301

(58) Field of Search .................................. 438/243, 234, 438/246, 244; 257/301

(56) References Cited

U.S. PATENT DOCUMENTS

| | | | |
|---|---|---|---|
| 6,399,977 B1 | * | 6/2002 | Alsmeier ..................... 257/301 |
| 2002/0094619 A1 | * | 7/2002 | Mandelman et al. ....... 438/192 |
| 2002/0197792 A1 | * | 12/2002 | Hsu et al. ................... 438/246 |

* cited by examiner

Primary Examiner—Richard Elms
Assistant Examiner—Brad Smith

(57) ABSTRACT

A DRAM cell with a vertical transistor forms a buried strap outdiffusion with reduced lateral extent by shifting high temperature steps that affect the thermal budget before the initial buried strap diffusion. The gate conductor is formed in two steps, with poly sidewalls being put down above a sacrificial Trench top oxide to form a self-aligned poly-gate insulator structure before the formation of the LDD extension.

21 Claims, 5 Drawing Sheets

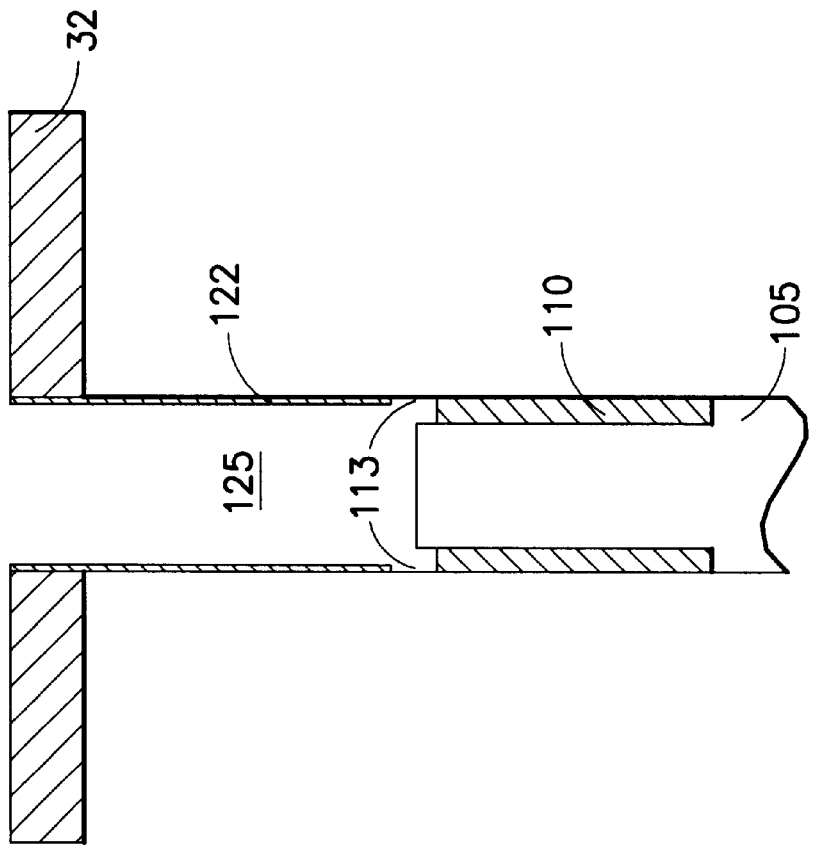
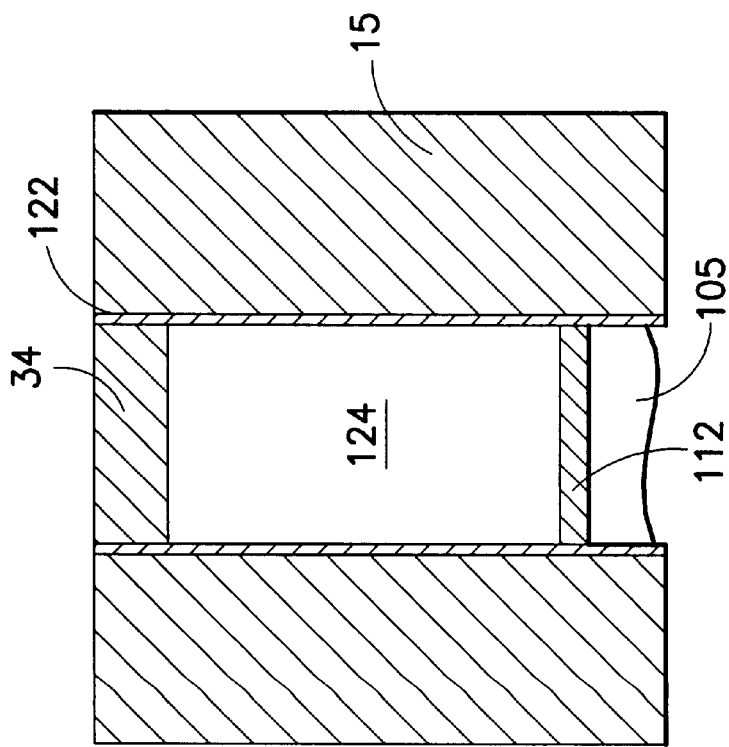
FIG.4
FIG.3

BURIED STRAP WITH LIMITED OUTDIFFUSION AND VERTICAL TRANSISTOR DRAM

TECHNICAL FIELD

The field of the invention is that of forming DRAM cells employing vertical transistors in a trench capacitor.

BACKGROUND OF THE INVENTION

As the minimum feature size is reduced in back to back vertical MOSFET DRAM cells, the P-well doping required to avoid interaction between cells must be increased. If not, two cells that share a bitline could affect one another. However, increased P-well doping in the vicinity of the buried strap diffusion is known to result in an increased electric field, storage node junction leakage and reduction of the retention time, so that reduced P-well doping is preferred for better performance of the cell. There is a conflict between reduced interaction between cells and maintaining retention time within a cell. This conflict means that the problem cannot be solved by changing the dopant concentration in the P-well. In particular, simply increasing the P-well concentration increases the leakage current from the cell, which causes the charge stored in the cell to leak out at a greater rate. The increased leakage means, in turn, that the refresh rate of reading data out of the cell and writing the same data back in (with the standard new value for the voltage stored in the capacitor) must be increased so that the system can read the data out before it has degraded so much that the state of the data cannot be determined.

An approach used to limit cell to cell interaction is the reduction of the spatial extent of the buried strap diffusion, since the edge of the diffusion will mark the start of the depletion, and/or reducing the abruptness of the doping profile. This approach has not been very successful because high temperature processes following buried strap formation spread the outdiffusion.

In the past, arsenic, which forms an abrupt concentration profile, has been used as the dopant in the buried strap, since it produces a small diffused region. Phosphorous has not been used, though it would produce a smoother dopant profile, because it spreads over a much greater extent that arsenic. Smoothing out the edge or tail of the buried strap diffusion is another approach to limit the interactions from one cell to another. The use of phosphorous would indeed produce increased smoothness, but at the cost of spreading the geometrical extent of the diffusion, and thus spreading the effect of one cell on another cell.

A related problem to the extent of the buried strap is the thickness of the trench top oxide insulator between the top of the capacitor electrode and the transistor gate. If the Trench top oxide is too thin, there can be leakage or even a short. If it is too thick, so that there is no adequate overlap between the strap outdiffusion and the gate conductor, the current drive of the transistor can be degraded.

SUMMARY OF THE INVENTION

The invention relates to a method of forming a DRAM cell employing a vertical transistor in a trench capacitor, with reduced outdiffusion of the buried strap.

Accordingly, a method is provided of forming a DRAM cell. The method includes forming a trench in a semiconductor substrate and forming a capacitor in a lower portion of the trench having an insulating trench collar and a capacitor center electrode. The center electrode is recessed to a capacitor depth, leaving an electrode top surface. The collar is then recessed below the electrode top surface, thereby forming a buried strap aperture between the center electrode and the trench sidewalls. The buried strap aperture is filled with a temporary insulator. A set of isolation trenches are formed in the substrate to an isolation trench depth and then filled with an insulator. After forming and filling the isolation trenches, a conductive buried strap is formed in contact with the center electrode and adjacent to the trench sidewalls. A separation insulator is then formed above the buried strap, and a gate insulator is formed adjacent the trench sidewalls and above the buried strap. Thereafter, a transistor gate electrode is then deposited above the separation insulator.

According to an aspect of the invention, high temperature processes are performed before the buried strap is formed, thereby reducing the extent of outdiffusion of the buried strap.

According to another aspect of the invention, isolation trenches for isolating neighboring DRAM cell and/or neighboring transistors are formed before the buried strap is formed.

According to another aspect of the invention, a strap diffusion is formed which is self-aligned to the vertical gate conductor.

As may be possible according to an aspect of the invention is the avoidance of any pad oxide undercut.

BRIEF DESCRIPTION OF THE DRAWINGS

FIG. 3 shows in cross section the DRAM cell after forming the isolation trenches separating cells.

FIG. 4 shows in cross section the DRAM cell after performing a second recess.

DETAILED DESCRIPTION OF THE PREFERRED EMBODIMENTS

Figure 1:
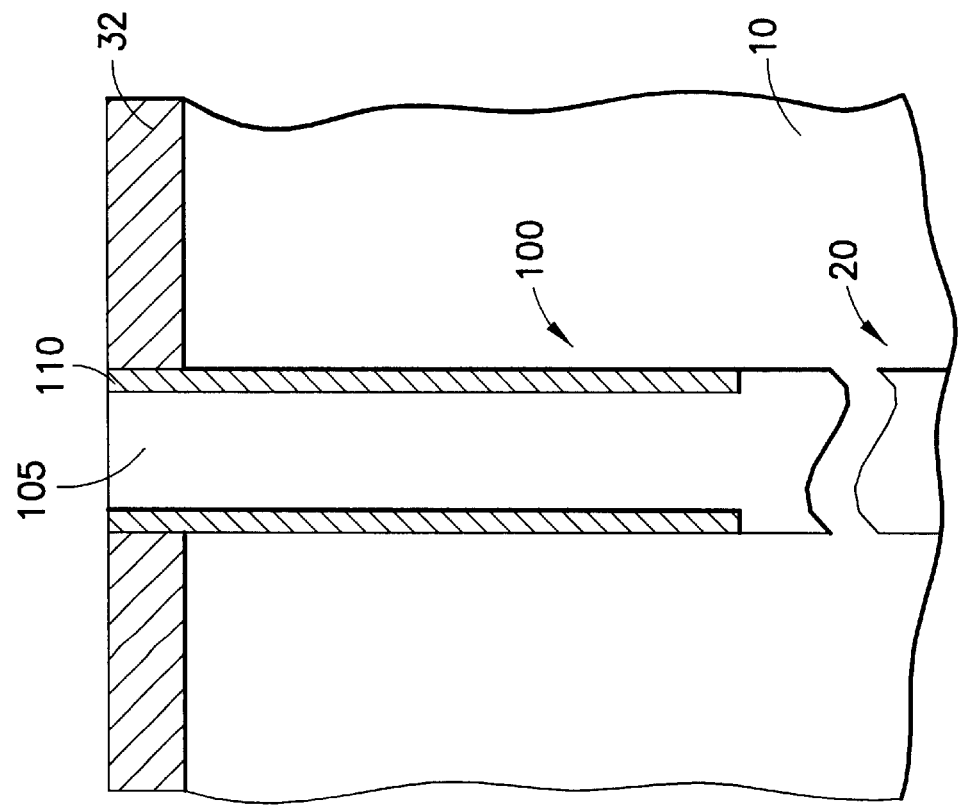
FIG. 1 shows in cross section a DRAM cell being constructed according to the invention after preliminary steps.

FIG. 1 shows a cross section of a DRAM cell 100 formed in substrate 10 after preliminary steps. Standard processing is used to etch the deep trench and construct capacitor 20 by etching a trench with a highly directional etch to a relatively deep depth, then forming a layer of capacitor dielectric in the inner surface of the trench. A deposition of a doped material (e.g. poly) completes the lower portion of the trench. The polysilicon (poly) center electrode 105 has been filled to the top of the trench inside oxide (SiO2) collar 110 and planarized to the level of pad nitride (Si3N4) 32.

Figure 2:
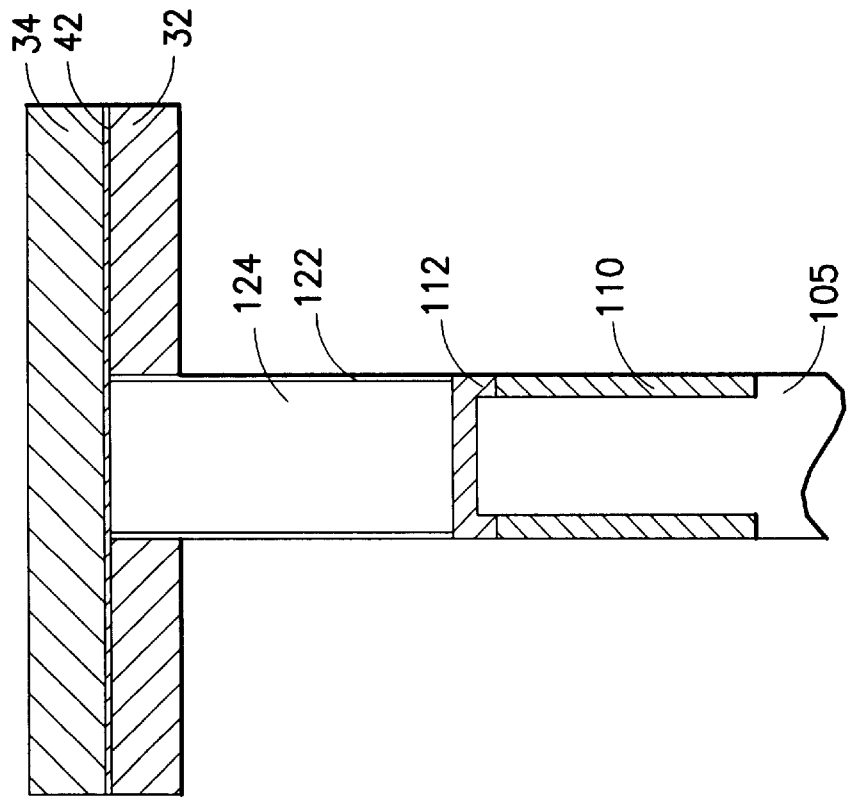
FIG. 2 shows in cross section the DRAM cell of FIG. 1 after recessing the center electrode of the lower capacitor.

In the next stage, the result of which is shown in FIG. 2, the process recesses the DT poly 105 to a capacitor depth, where the capacitor ends and the buried strap will be formed to connect the top surface of the capacitor center electrode to the vertical transistor by forming a conductive path into the single-crystal substrate and then upward to form the lower electrode of the vertical transistor. The exposed portion of collar oxide 110 has been removed, with an overetch that recesses oxide 110 slightly below the top surface of poly 105, forming a buried strap aperture, A temporary insulating layer of oxide 112 has been formed on top of the DT poly, extending into the recessed portion of collar 110.

A sacrificial thermal oxide sidewall 122 has been grown with a thickness of 3–10 nm. Thin (<10 nm) nitride spacers (line 122 denoting both oxide and nitride) have been formed on the trench sidewalls.

The trench aperture has been filled with a temporary fill of poly 124 and planarized to the level of the pad nitride 32.

As will be apparent in the later discussion, even though the problem addressed by the present invention is the extent of the buried strap, the solution involves some elements on the surface of the wafer. A thin etch stop layer of oxide 42 has been deposited on the surface over pad nitride 32 and a second pad nitride 34 has been deposited.

FIG. 3 shows a cross section perpendicular to the plane of the paper of FIGS. 1 and 2 showing the area after the IT fill step and planarization to the level of the second pad nitride. An active area mask protecting the area that will include the upper electrode of the vertical transistors (and the areas for transistor formation in the support and logic circuits outside the array) has been put down and patterned. A set of apertures for STI isolation has been etched outside the AA mask.

The STI apertures are filled with oxide 15 that is planarized to the level of the 2nd pad nitride 34 (which is above the wafer surface). Second pad nitride 34 has served its purpose and is stripped along with oxide etch stop 42.

FIG. 4 shows the result of removing temporary poly 124, leaving aperture 125, having oxide 112 on the trench top oxide. Oxide 112 is then removed, exposing buried strap apertures 113, with exposed silicon walls, for the buried strap. Removal of STI fill material during this oxide removal is compensated by the extra thickness provided by second pad nitride 34. Advantageously, the significant thermal load of the isolation trenches is imposed on the wafer before the buried strap is formed, thus limiting the amount of diffusion of the buried strap.

Poly buried strap 114 is formed by a conventional process of deposition, including a buried strap poly etch (BSPE) to remove the poly material from the sidewalls, the top surface and all places except the apertures. The dopant from poly strap 114 (e.g. arsenic) is diffused into a buried strap diffusion area 115 in the silicon substrate.

Figure 5:
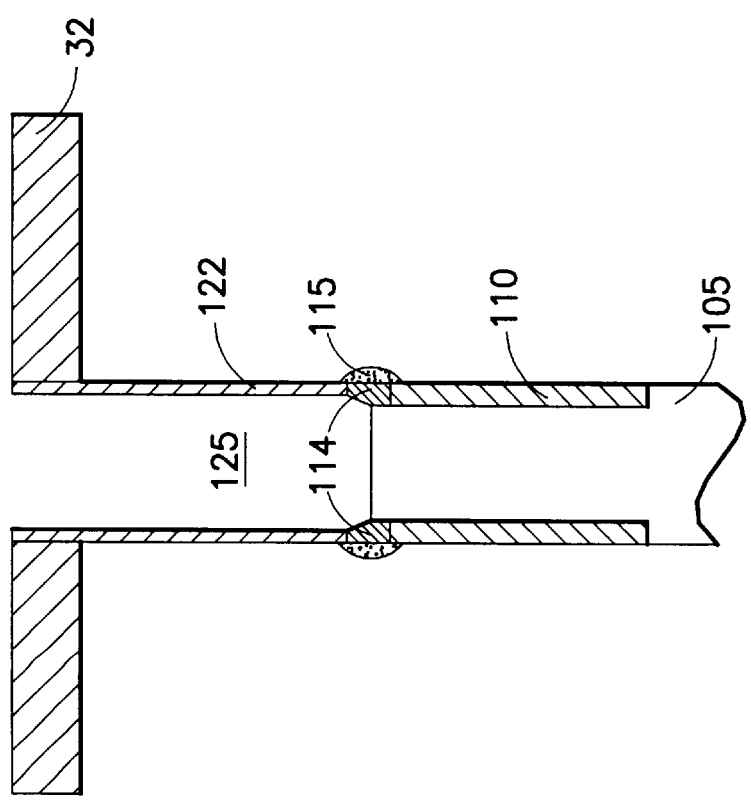
FIG. 5 shows in cross section the DRAM cell after performing the outdiffusion of the buried strap.

The nominal lateral extent (after all thermal steps) of outdiffusion 115 is 30–50 nm. The result is shown in FIG. 5.

Figure 6:
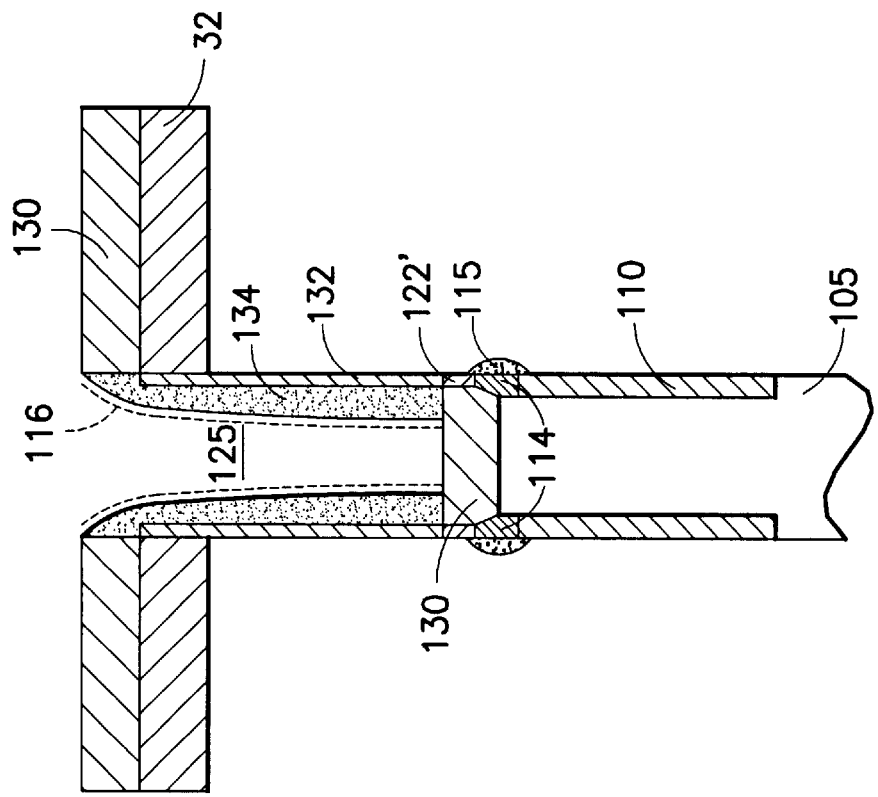
FIG. 6 shows in cross section the DRAM cell after forming poly sidewalls that will remain in the cell.

Extensive steps according to the invention are performed after the formation of strap 114, in contrast to prior art methods. FIG. 6 shows the result of depositing HDP oxide, forming a temporary layer of oxide 130 on top of the buried strap and on top of the pad nitride. Sidewall layers 122 (first nitride, then sacrificial oxide beneath nitride) are stripped leaving a small stub of oxide 122' adjacent to temporary oxide 130.

Gate oxide 132 is grown on the trench sidewalls (and also in other transistors—support and logic). The gate oxide is thus self-aligned to the temporary oxide 130. This is the last high temperature step.

Continuing with the steps in FIG. 6, doped poly sidewalls 134 ($N^+$) are formed by conformal deposition and then RIE'd to remove horizontal components. The result, as shown in FIG. 6, is a poly sidewall (that will become part of the gate) self-aligned to gate oxide 132.

Optionally, thin nitride layer 116 is deposited over poly sidewalls 134 as a gas diffusion barrier to prevent the LDD dopant from penetrating into the transistor body.

Figure 7:
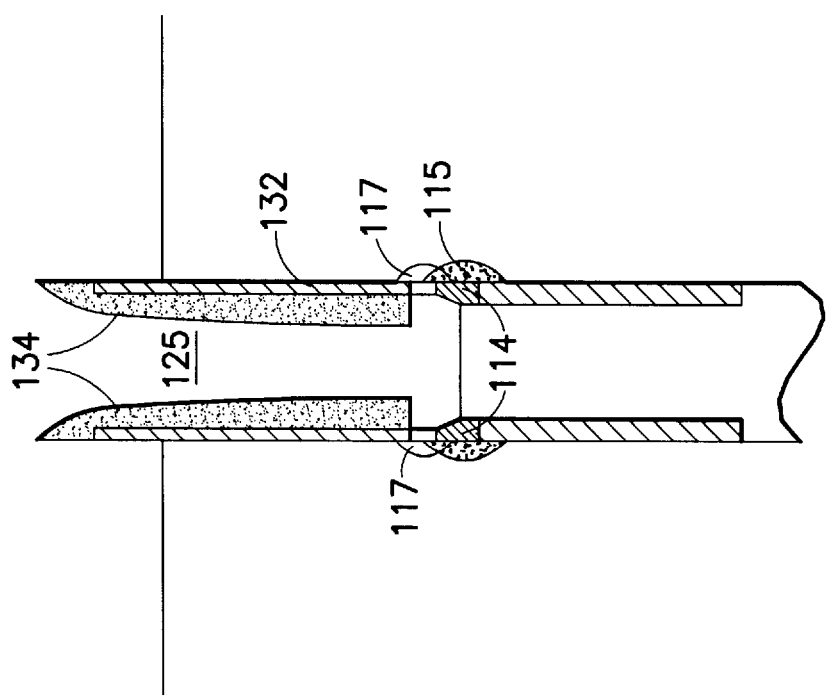
FIG. 7 shows in cross section the DRAM cell after stripping the upper portion of the trench walls.

Referring to FIG. 7, temporary oxide 130 has been removed by an isotropic etch, (wet or dry), leaving exposed silicon walls above buried strap 114 and below poly sidewalls 134.

A LDD extension 117 of the same polarity as outdiffusion 115 is formed in the silicon walls by gas phase doping with a light dose ($1-5\times10^{18}/cm^3$ at the silicon surface. Phosphorous may be used instead of arsenic (for an NFET) to provide a more gradual profile, since the thermal exposure following this step is low. Next, the pad nitride 32 (and optional nitride on poly spacers 134) is removed.

Figure 8:
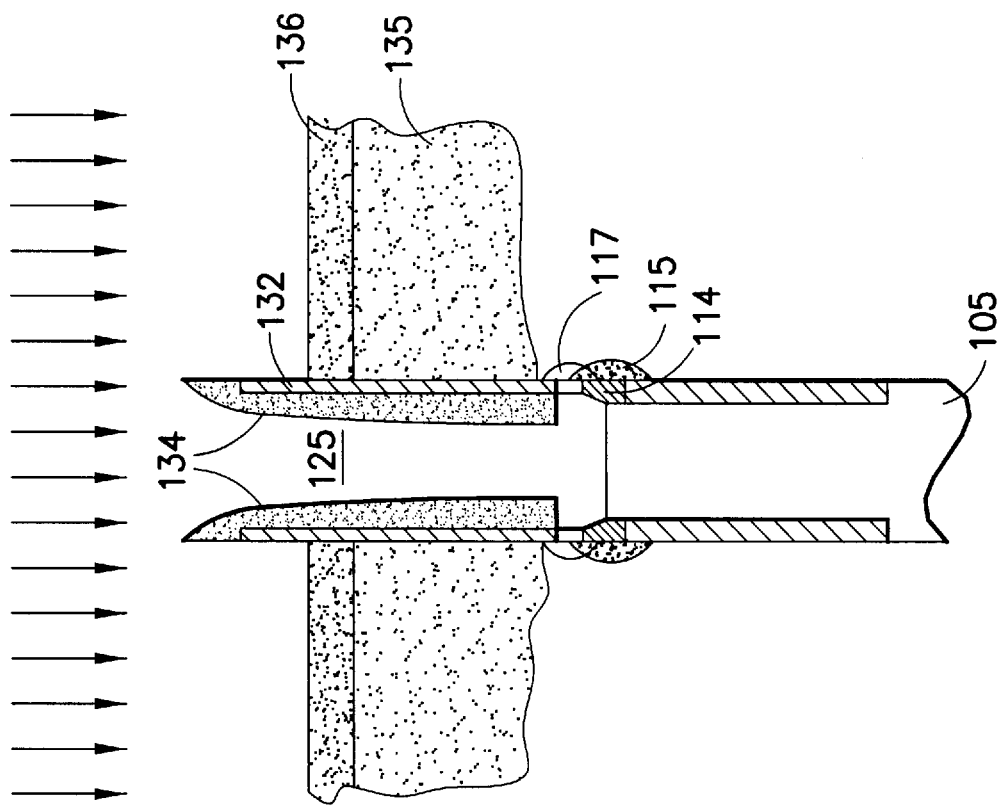
FIG. 8 shows in cross section the DRAM cell after implanting the p-well region and upper transistor diffusion region.

Referring to FIG. 8, an implant step is shown to implant the P-well concentration in region 135 between trenches, (which also forms the dopant concentration in the transistor body). At the same time, the upper transistor source-drain diffusion 136 at the top surface of the silicon substrate is implanted, forming a path between the transistor body and the bitline.

Figure 9:
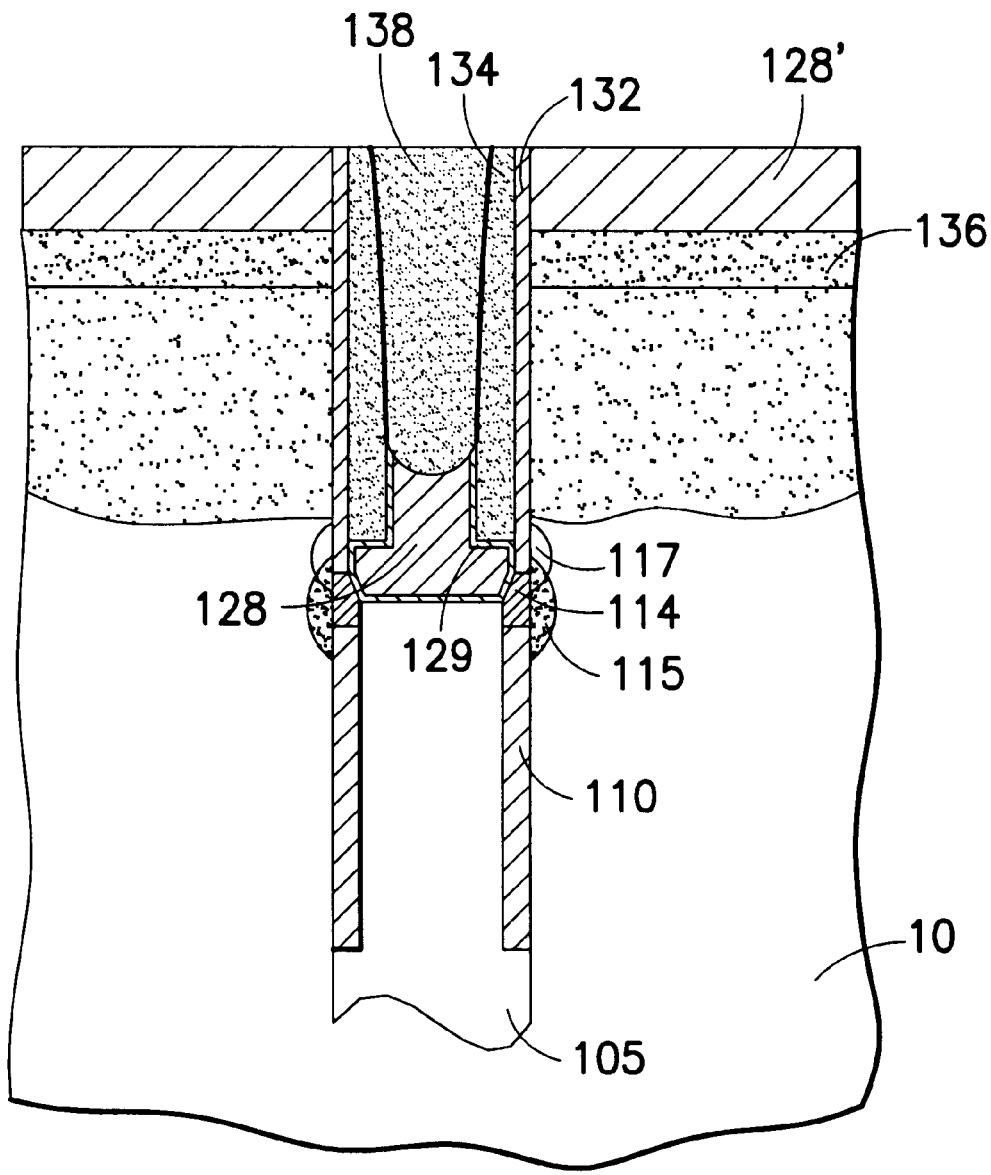
FIG. 9 shows in cross section the final DRAM cell after forming the Trench top oxide and completing the gate conductor therein.

FIG. 9 shows the final cell, with a filled gate electrode 138 deposited between the conductive sidewalls 134. A thin ½–5 nm (preferably 1 nm) layer of conformal nitride 129 is deposited over the top of the capacitor electrode 105 and the lower portion of poly spacers 134. This layer assists the Trench top oxide in insulating the capacitor electrode 105 and the silicon sidewall from the gate electrode and increases the reliability of the insulation.

A Trench top oxide 128 is deposited, preferably using a combination of conformal CVD to fill in awkward places, followed by HDP. An isotropic oxide etch removes excess Trench top oxide from the upper portion of the trench aperture. A substantial amount of oxide will remain on the surface to form a layer of array top oxide. The aperture is filled with poly 138 and planarized to the level of the array top oxide 128'.

The remainder of the integrated circuit continues with conventional processing to form lateral transistors in support areas (and logic areas in the case of an embedded DRAM array).

The invention is not confined to bulk silicon substrates, but may be used with SiGe wafers and SOI wafers. The DRAM array may be on a dedicated memory chip or may be part of an ASIC or other chip having an embedded DRAM array.

While the invention has been described in terms of a single preferred embodiment, those skilled in the art will recognize that the invention can be practiced in various versions within the spirit and scope of the following claims.

What is claimed is:

1. A method of forming a DRAM cell containing a trench capacitor and a vertical FET, comprising the steps of:

forming a trench having trench sidewalls in a semiconductor substrate;

forming a capacitor in a lower portion of said trench, with an insulating trench collar and a capacitor center electrode;

recessing said center electrode to a capacitor depth, leaving an electrode top surface;

recessing said collar below said electrode top surface, thereby forming a buried strap aperture between said center electrode and said trench sidewalls and filling said buried strap aperture with a temporary insulator;

forming a set of isolation trenches in said substrate to an isolation trench depth and filling said isolation trenches with an insulator:

after said step of forming and filling said set of isolation trenches, forming a conductive buried strap disposed in contact with said center electrode and adjacent to said trench sidewalls;

forming a separation insulator above said buried strap; forming a gate insulator adjacent said trench sidewalls and above said buried strap; and depositing a transistor gate electrode above said separation insulator further, comprising the steps of:

after said step of filling said buried strap aperture with a temporary insulator and before said step of forming a set of isolation trenches, growing a sacrificial layer of oxide in said trench sidewalls;

depositing an insulating sidewall layer adjacent to said layer of sacrificial oxide; and filling said trench with a temporary fill layer.

2. A method according to claim 1, further comprising the steps of:

depositing a second pad layer above a first pad layer; and filling and planarizing said isolation trenches to the level of said second pad layer.

3. A method according to claim 1, further comprising the steps of:

depositing a second pad layer above a first pad layer; and filling and planarizing said isolation trenches to the level of said second pad layer.

4. A method according to claim 2, further comprising the steps of:

removing said temporary insulator in said buried strap aperture; and forming said buried strap in said buried strap aperture.

5. A method according to claim 4, further comprising the steps of:

depositing a second pad layer above a first pad layer; and filling and planarizing said isolation trenches to the level of said second pad layer.

6. A method according to claim 4, further comprising the steps of:

depositing a second temporary layer of insulator on said electrode top surface and extending vertically higher than said buried strap by an extension distance;

forming said gate insulator above said second temporary layer of insulator;

recessing said second temporary layer of insulator and exposing a portion of trench sidewalls over said extension distance; and doping said trench sidewalls with a buried strap extension dopant through said exposed trench sidewalls.

7. A method according to claim 4, further comprising the steps of:

before said step of removing said temporary layer of insulator, depositing conductive sidewalls over said gate insulator.

8. A method according to claim 7, in which said step of depositing a gate electrode comprises a step of depositing a conductive material adjacent to said conductive sidewalls, whereby said conductive sidewalls become part of said gate electrode.

9. A method according to claim 8, further comprising a step of depositing a nitride layer over said conductive sidewalls and stripping said nitride layer from said conductive sidewalls after said step of doping said trench sidewalls with a buried strap extension.

10. A method according to claim 4, in which said step of doping said trench sidewalls with a buried strap extension dopant is performed using phosphorous for an NFET.

11. A method according to claim 1, further comprising the steps of:

removing said temporary fill layer;

removing said temporary insulator in said buried strap aperture; and forming said buried strap in said buried strap aperture.

12. A method according to claim 11, further comprising the steps of:

depositing a second pad layer above a first pad layer; and filling and planarizing said isolation trenches to the level of said second pad layer.

13. A method according to claim 11, further comprising the steps of:

depositing a second temporary layer of insulator on said electrode top surface and extending vertically higher than said buried strap by an extension distance;

forming said gate insulator above said second temporary layer of insulator;

recessing said second temporary layer of insulator and exposing a portion of trench sidewalls over said extension distance; and doping said trench sidewalls with a buried strap extension dopant through said exposed trench sidewalls.

14. A method according to claim 11, further comprising the steps of:

before said step of removing said temporary layer of insulator, depositing conductive sidewalls over said gate insulator.

15. A method according to claim 14, in which said step of depositing a gate electrode comprises a step of depositing a conductive material adjacent to said conductive sidewalls, whereby said conductive sidewalls become part of said gate electrode.

16. A method according to claim 15, further comprising a step of depositing a nitride layer over said conductive sidewalls and stripping said nitride layer from said conductive sidewalls after said step of doping said trench sidewalls with a buried strap extension.

17. A method according to claim 11, in which said step of doping said trench sidewalls with a buried strap extension dopant is performed using phosphorous for an NFET.

18. A method of forming a DRAM cell comprising the steps of:

forming a trench having trench sidewalls in a semiconductor substrate;

forming a capacitor in a lower portion of said trench, with an insulating trench collar and a capacitor center electrode;

recessing said center electrode to a capacitor depth, leaving an electrode top surface;

recessing said collar below said electrode top surface and depositing a first temporary layer of insulator over said electrode top surface of said center electrode;

forming a set of insulating members in said substrate on opposite sides of said trench;

removing said first temporary layer of insulator and forming a conductive buried strap disposed in contact with said top surface and adjacent to said trench sidewalls;

depositing a second temporary layer of insulator on said top surface and extending vertically higher than said buried strap by an extension distance;

forming a gate insulator above said second temporary layer of insulator;

depositing conductive sidewalls adjacent to said gate insulator and above said second temporary layer of insulator;

removing said second temporary layer of insulator;

doping said substrate to form a buried strap extension after said steps of forming said gate insulator;

depositing a final layer of insulator above said buried strap and below said conductive sidewalls; and depositing a transistor electrode above said final layer of insulator and adjacent to said conductive sidewalls.

19. A method according to claim 18, further comprising the steps of:

after said step of filling said buried strap aperture with a temporary insulator and before said step of forming a set of isolation trenches, growing a sacrificial layer of oxide in said trench sidewalls;

depositing an insulating sidewall layer adjacent to said layer of sacrificial oxide; and filling said trench with a temporary fill layer.

20. A method according to claim 18, further comprising the steps of:

depositing a second pad layer above a first pad layer; and filling and planarizing said isolation trenches to the level of said second pad layer.

21. A method according to claim 18, further comprising the steps of:

depositing a second temporary layer of insulator on said electrode top surface and extending vertically higher than said buried strap by an extension distance;

forming said gate insulator above said second temporary layer of insulator;

recessing said second temporary layer of insulator and exposing a portion of trench sidewalls over said extension distance; and doping said trench sidewalls with a buried strap extension dopant through said exposed trench sidewalls.

* * * * *